United States Patent [19]
Watanabe

[11] Patent Number: 5,604,495
[45] Date of Patent: Feb. 18, 1997

[54] DATA COMPRESSION METHOD AND SYSTEM

[75] Inventor: Hiroyuki Watanabe, Tokyo, Japan

[73] Assignee: Seta Co., Ltd., Tokyo, Japan

[21] Appl. No.: 426,620

[22] Filed: Apr. 21, 1995

[30] Foreign Application Priority Data

Apr. 22, 1994 [JP] Japan .................................. 6-107837

[51] Int. Cl.$^6$ .................................................. H03M 7/00
[52] U.S. Cl. .................................................. 341/51; 341/106
[58] Field of Search .................................. 341/51, 65, 67, 341/79, 87, 106

[56] References Cited

U.S. PATENT DOCUMENTS

| | | |
|---|---|---|
| 4,021,782 | 5/1977 | Hoerning . |
| 4,558,302 | 12/1985 | Welch . |
| 4,612,532 | 9/1986 | Bacon et al. ............................ 341/51 |
| 4,814,746 | 3/1989 | Miller et al. . |
| 4,847,619 | 7/1989 | Kato et al. . |
| 4,870,415 | 9/1989 | Van Maren et al. . |
| 4,876,541 | 10/1989 | Storer . |
| 5,003,307 | 3/1991 | Whiting et al. . |
| 5,016,009 | 5/1991 | Whiting et al. . |
| 5,049,881 | 9/1991 | Gibson et al. . |
| 5,140,321 | 8/1992 | Jung . |
| 5,142,282 | 8/1992 | Tobin et al. . |
| 5,150,119 | 9/1992 | Yoshida et al. . |
| 5,153,591 | 10/1992 | Clark ........................................ 341/51 |
| 5,175,543 | 12/1992 | Lantz . |
| 5,243,341 | 9/1993 | Seroussi et al. . |
| 5,253,325 | 10/1993 | Clark . |
| 5,254,990 | 10/1993 | Yoshida et al. . |

FOREIGN PATENT DOCUMENTS

0573208  12/1993  European Pat. Off. .

*Primary Examiner*—Brian K. Young
*Attorney, Agent, or Firm*—Oblon, Spivak, McClelland, Maier & Neustadt, P.C.

[57] ABSTRACT

A lossless type data compression method employing a dictionary system is suitable for character generator of a game machine and so forth. A working data strings are generated from an original data stream. Two sequential working data strings are combined to form a combined string. A dictionary is generated by registering the combined strings having occurrence frequency higher than a given value with a dictionary number. The combined strings in the data stream are replaced with the dictionary numbers corresponding to the combined strings in the dictionary.

11 Claims, 8 Drawing Sheets

FIG. 5

| | | | | | | | | | | | | | | | |
|---|---|---|---|---|---|---|---|---|---|---|---|---|---|---|---|
| 00 | 00 | 00 | 00 | 00 | 00 | 00 | 00 | 00 | 00 | 00 | 00 | 00 | 00 | 36 | 39 |
| 00 | 00 | 00 | 00 | 00 | 00 | 00 | 00 | 00 | 00 | 00 | 00 | 00 | 00 | 3c | 39 |
| 00 | 00 | 00 | 00 | 00 | 00 | 00 | 00 | 00 | 00 | 00 | 00 | 00 | 38 | 3d | 38 |
| 00 | 00 | 00 | 00 | 00 | 00 | 00 | 00 | 00 | 00 | 00 | 00 | 00 | 33 | 3c | 3b |
| 00 | 00 | 00 | 00 | 00 | 00 | 00 | 00 | 00 | 00 | 00 | 00 | 00 | 36 | 3c | 36 |
| 00 | 00 | 00 | 00 | 00 | 00 | 00 | 00 | 00 | 00 | 00 | 00 | 00 | 38 | 37 | 33 |
| 00 | 00 | 00 | 00 | 00 | 00 | 00 | 00 | 00 | 00 | 00 | 00 | 00 | 36 | 37 | 33 |
| 00 | 00 | 00 | 00 | 00 | 00 | 00 | 00 | 00 | 00 | 00 | 00 | 0c | 33 | 36 | 33 |
| 00 | 00 | 00 | 00 | 00 | 00 | 00 | 00 | 00 | 00 | 00 | 00 | 15 | 15 | 0c | 32 |
| 00 | 00 | 00 | 00 | 00 | 00 | 00 | 00 | 00 | 00 | 00 | 00 | 0c | 08 | 05 | 05 |
| 00 | 00 | 00 | 00 | 00 | 00 | 00 | 00 | 00 | 00 | 00 | 0d | 1a | 09 | 1a | 17 |
| 00 | 00 | 00 | 00 | 00 | 00 | 00 | 00 | 00 | 00 | 00 | 0d | 1a | 1a | 0b | 15 |
| 00 | 00 | 00 | 00 | 00 | 00 | 00 | 00 | 00 | 00 | 00 | 0c | 1a | 17 | 17 | 15 |
| 00 | 00 | 00 | 00 | 00 | 00 | 00 | 00 | 00 | 00 | 00 | 1a | 0c | 0b | 0b | 20 |
| 00 | 00 | 00 | 00 | 00 | 00 | 00 | 00 | 00 | 00 | 00 | 0c | 17 | 20 | 0a | 0a |
| 00 | 00 | 00 | 00 | 00 | 00 | 00 | 00 | 00 | 00 | 17 | 0c | 0b | 0b | 20 | 0a |
| 39 | 35 | 34 | 31 | 31 | 35 | 31 | 31 | 32 | 32 | 0b | 0a | 0a | 20 | 20 | 07 |
| 35 | 35 | 33 | 31 | 2f | 31 | 35 | 34 | 2f | 31 | 0a | 05 | 25 | 0a | 0a | 0a |
| 3b | 36 | 32 | 32 | 31 | 2f | 37 | 30 | 31 | 2e | 05 | 04 | 04 | 25 | 25 | 05 |
| 35 | 17 | 17 | 15 | 32 | 31 | 36 | 35 | 2f | 2f | 0b | 04 | 04 | 04 | 04 | 04 |
| 0d | 0b | 0b | 20 | 17 | 33 | 33 | 35 | 32 | 30 | 0b | 04 | 04 | 04 | 04 | 04 |
| 0c | 0b | 0a | 20 | 17 | 36 | 32 | 30 | 35 | 30 | 0b | 04 | 25 | 25 | 05 | 0a |
| 17 | 17 | 20 | 17 | 33 | 33 | 32 | 30 | 35 | 34 | 27 | 0b | 05 | 20 | 20 | 14 |
| 32 | 0c | 17 | 32 | 36 | 32 | 30 | 32 | 33 | 27 | 14 | 20 | 20 | 14 | 27 | 35 |
| 33 | 32 | 32 | 36 | 34 | 30 | 30 | 33 | 30 | 32 | 00 | 00 | 0d | 35 | 32 | 34 |
| 0a | 17 | 0d | 34 | 30 | 32 | 30 | 30 | 31 | 31 | 34 | 35 | 34 | 28 | 14 | 20 |
| 15 | 0a | 0a | 04 | 32 | 35 | 30 | 31 | 30 | 35 | 34 | 00 | 00 | 00 | 00 | 20 |
| 07 | 0b | 20 | 0a | 04 | 0a | 0b | 17 | 00 | 00 | 00 | 00 | 00 | 00 | 00 | 00 |
| 0b | 0b | 0c | 17 | 0b | 15 | 00 | 00 | 00 | 00 | 00 | 00 | 00 | 00 | 00 | 00 |
| 0a | 0a | 0b | 0c | 17 | 00 | 00 | 00 | 00 | 00 | 00 | 00 | 00 | 00 | 00 | 00 |
| 20 | 0b | 0a | 00 | 00 | 00 | 00 | 00 | 00 | 00 | 00 | 00 | 00 | 00 | 00 | 00 |
| 0b | 17 | 00 | 00 | 00 | 00 | 00 | 00 | 00 | 00 | 00 | 00 | 00 | 00 | 00 | 00 |

FIG. 6

| 80 | 81 | 82 | 83 | 84 | 85 | 86 | 87 |
|---|---|---|---|---|---|---|---|
| 0000 | 000c | 000d | 0036 | 0404 | 0a0a | 0b04 | 0b0a |
| 88 | 89 | 8a | 8b | 8c | 8d | 8e | 8f |
| 0b0b | 0b20 | 0c0b | 0c17 | 1500 | 1700 | 1717 | 200a |
| 90 | 91 | 92 | 93 | 94 | 95 | 96 | 97 |
| 2017 | 2020 | 3031 | 3032 | 3035 | 3131 | 3230 | 3232 |
| 98 | 99 | 9a | | | | | |
| 3300 | 3534 | 3632 | | | | | |
| | | | | | | | |
| | | | | | | | |
| | | | | | | | |
| | | | | | | | |

| 80 | 81 | 82 | 83 | 84 | 85 | 86 | 87 |
|----|----|----|----|----|----|----|----|
| 0000 | 000c | 000d | 0036 | 0404 | 0a0a | 0b04 | 0b0a |
| 88 | 89 | 8a | 8b | 8c | 8d | 8e | 8f |
| 0b0b | 0b20 | 0c0b | 0c17 | 1500 | 1700 | 1717 | 200a |
| 90 | 91 | 92 | 93 | 94 | 95 | 96 | 97 |
| 2017 | 2020 | 3031 | 3032 | 3035 | 3131 | 3230 | 3232 |
| 98 | 99 | 9a | 9b | 9c | 9d | 9e | 9f |
| 3300 | 3534 | 3632 | 8000 | 8080 | 8c80 | 8d80 | 9880 |
|  |  |  |  |  |  |  |  |
|  |  |  |  |  |  |  |  |
|  |  |  |  |  |  |  |  |
|  |  |  |  |  |  |  |  |

| 80 | 81 | 82 | 83 | 84 | 85 | 86 | 87 |
|---|---|---|---|---|---|---|---|
| 0000 | 000c | 000d | 0036 | 0404 | 0a0a | 0b04 | 0b0a |
| 88 | 89 | 8a | 8b | 8c | 8d | 8e | 8f |
| 0b0b | 0b20 | 0c0b | 0c17 | 1500 | 1700 | 1717 | 200a |
| 90 | 91 | 92 | 93 | 94 | 95 | 96 | 97 |
| 2017 | 2020 | 3031 | 3032 | 3035 | 3131 | 3230 | 3232 |
| 98 | 99 | 9a | 9b | 9c | 9d | 9e | 9f |
| 3300 | 3534 | 3632 | 8000 | 8080 | 8c80 | 8d80 | 9880 |
| a0 | a1 | a2 | a3 | a4 | a5 | a6 | |
| 9c00 | 9c80 | 9c9b | 9c9c | 9d9c | 9e9c | 9f9c | |
| | | | | | | | |
| | | | | | | | |

| 80 | 81 | 82 | 83 | 84 | 85 | 86 | 87 |
|----|----|----|----|----|----|----|----|
| 0000 | 000c | 000d | 0036 | 0404 | 0a0a | 0b04 | 0b0a |
| 88 | 89 | 8a | 8b | 8c | 8d | 8e | 8f |
| 0b0b | 0b20 | 0c0b | 0c17 | 1500 | 1700 | 1717 | 200a |
| 90 | 91 | 92 | 93 | 94 | 95 | 96 | 97 |
| 2017 | 2020 | 3031 | 3032 | 3035 | 3131 | 3230 | 3232 |
| 98 | 99 | 9a | 9b | 9c | 9d | 9e | 9f |
| 3300 | 3534 | 3632 | 8000 | 8080 | 8c80 | 8d80 | 9880 |
| a0 | a1 | a2 | a3 | a4 | a5 | a6 | a7 |
| 9c00 | 9c80 | 9c9b | 9c9c | 9d9c | 9e9c | 9f9c | a380 |
| a8 | | | | | | | |
| a3a0 | | | | | | | |

DATA COMPRESSION METHOD AND SYSTEM

BACKGROUND OF THE INVENTION

1. Field of the Invention

The present invention relates generally to a data compression method and system. More specifically, the invention relates to a lossless type data compression method employing dictionary system suitable for a character generator for a game machine and so forth.

2. Description of the Related Art

Conventionally, various data compression methods have been developed for reduction of necessary capacity of storage devices in data processing systems and for improvement of data transmission efficiency. The data compression method may be generally divided into lossy type and lossless type in the viewpoint of capability of bidirectional coding.

The lossy type data compression method is nonreversible coding system. JPEG (Joint Photographic Coding Expert Group), MPEG (Moving Picture Image Coding Expert Group), H.261 for PMS (Picture-phone Meeting Service) or picture telephone and so forth are internationally standardized systems of this lossy type data compression. The lossy type data compression is advantage for high compression rate, i.e. approximately $\frac{1}{50}$ to $\frac{1}{1000}$ while loss of information amount is caused.

On the other hand, the lossless type data compression method is a reversible data coding system. This type of data compression system generally holds data compression rate approximately ½ and thus cannot achieve high compression rate as achieved by the lossy type data compression method. However, the lossless type data compression method is advantageous for capability of encoding and decoding without loosing an original data. Run Length coding, Huffman coding, Arithmetic coding, LZ (Lemple-Ziv) system and so forth are typical standardized systems in the lossless type data compression methods.

The run length coding system is the simplest lossless type coding system. The system utilizes the fact that probability of appearance is differentiated depending upon the value of the run length. Therefore, by assigning shorter code for the run length having higher probability, data compression is achieved. This coding system has been employed in CD-I (Compact Disc-Interface), Video for Windows (Trademark: Microsoft) and so forth.

Huffman coding system is a data compression system primarily used in the field of image processing. MH (Modified Huffman) coding of G3 standard facsimile and so forth are application of the Huffman coding.

It should be noted that JPEG, MPEG, or H.261 also employs Huffman coding. However, since these method use DCT (Discrete Cosine Transfer) in preparatory process, they are classified as lossy type.

Arithmetic coding system is used in JBIG (Joint Bi-level Image Coding Expert Group) which is next age coding system in the facsimile. The JBIEG may handle redundant data stream which cannot be handled by Huffman coding system, by unitary compression based on probability of occurrence of strings. Thus, the JBIEG realizes optimal data compression in view of information entropy.

In general. LZ system is a data compression system which performs data compression detecting repetition of strings. The LZ system is applied for a data compression tool for personal computers or for data backup cartridge tape recording apparatus and other products.

The LZ system generally includes LZ77 system, Ziv J. and Lempel, A. "A Universal Algorithm for Sequential Data Compression", IEEE Transaction on Information Theory, vol. IT-23, No. 3, pp 337–343, September, 1997 and LZ78 system, Ziv, J. and Lempel, A. "Compression of Individual Sequences via Variable Rate Coding" IEEE Translation on Information Theory, vol IT-24, No. 5, pp 530 to 536, September 1978. The former LZ77 system is also disclosed in U.S. Pat. Nos. 5,003,307 and 5,016,009. The later LZ78 system is also disclosed in U.S. Pat. Nos. 4,558,302 and 4,814,746. Algorithms of LZ77 and LZ78 systems are in common at the point where the currently objective string and processed strings are compared and the longest matching string is obtained through the comparison. However, LZ77 stores the processed strings in a buffer and takes means to handled the processed data as if the processed data in the buffer is slide on the input data stream. On the other hand, the LZ78 system employs means for assigning dedicated codes for processed strings and registering the codes in dictionary style.

As a result, in comparison of LZ77 and LZ78 systems in terms of function, LZ77 system is superior than the LZ78 system in terms of compression rate, and LZ78 system superior than the LZ77 system in terms of data processing speed.

On the other hand, in the field of gate machine, requirement for high level image expression is progressively growing. In the commercial gate machine, image expression utilizing three-dimensional CG (computer graphics) has been employed. The trend is extending to home use television game machines and multimedia systems. Thus, development for data processing systems capable of such high level image expression are progressed.

Complication of image expression causes increasing of data amount. Therefore, a demand for lossless type data compression method having high compression rate and capable of high speed encoding and decoding, is growing.

Particularly, in case of the game machine, unless the display screen reacts to operation of a button on a control pad by a user within $\frac{1}{60}$ to $\frac{1}{30}$ seconds (corresponding to display period of one or two field of color television signal), game becomes less interesting. Therefore, it is inherent to achieve both of the high compression rate and high speed encoding and decoding.

In this sense, the above-mentioned the LZ system (particularly LZ78) and LHA system, in which the LZ system and Huffman coding system may be said as suitable data compression method as data compression method.

However, in case of the LZ system, since respective of the individual strings as object for compression have variable, and algorithm for compression and decompression is complicate, the data processing procedure may contain large number of steps and the hardware construction may become complicate.

On the other hand, in the character generator in the game machine, a relatively small data block is handled. In the conventional data compression method, compression becomes impossible or at least insufficient in compression.

Also, the data block of the character generator in the game machine, in has a tendency to have high probability of occurrence of the same string, and not to cause significant variation of number of the data blocks corresponding to variation mode of the characters.

SUMMARY OF THE INVENTION

Therefore, it is an object of the present invention to provide a lossless type data compression method which permits high speed compression and decompression and can realize high compression rate irrespective of the size of data blocks.

According to one aspect of the invention, a data compression method, in which a data stream of a digital input signal is stored in first storage means and data compression of the data stream is performed with registering strings appearing in the data stream in a dictionary of second storage means, comprises:

performing first process step for designating R representing a repetition number of the following third to fifth process steps wherein R is an integer smaller than or equal to D, with taking a total data capacity of the original data stream being S×N bits, wherein S is an integer greater than or equal to 2 and N is an integer greater than or equal to 3, and a maximum dictionary register number D where D is $2^s$;

performing second process step for separating the original data stream of S bit length stored in the storage means and generating a working data stream by adding a nonconducting identifier bit for conversion into a working data stream having (S+1) bit working strings;

performing third process step for detecting combined string consisted of two sequential working strings in the working data stream up to D/Rth order in descending order from working string having largest occurrence frequency, and having occurrence frequency greater than or equal to 3;

performing fourth process step for registering compression dictionary data of (S+1) bits consisted of dictionary number and compression identifier bit, in the second storage means, corresponding to each of combined strings detected by the third process step; and firth process step for replacing combined string among combined strings in the working data stream matching with one of combined strings registered in the second storage means, with the compression dictionary data corresponding to the matching combined string, repeating the third to fifth process steps for R times with taking data stream replaced through the fifth process step as working data stream for outputting data stream stored in the first storage means and all combined string and compression dictionary data stored in the second storage means, after R times repletion, as compressed data.

In the alternative, when R=1, the second process step is performed without adding the non-compression identifier bit to establish the working data stream take the original strings as the working strings, and the fourth process step is performed with formulating the compression dictionary data solely with the S bit dictionary number.

In the foregoing construction, the number of repetition cycles of the third to fifth steps is designated in the first process step. The designated number of repetition cycles can be designated arbitrarily for appropriate for obtaining desired compression ratio within the range less than or equal to the maximum register number D of the directly generated by the second process step.

The second process step is a preparatory process for generating the working data stream consisted of working strings of (S+1) bit length by adding non-compression identifier bit (1 bit) for respective of the original strings (S bits) in the original data stream so that the working strings in non-compression state can be identified.

Generation of the dictionary and data compression process are performed through the third to fifth process steps. Generation of dictionary is performed per [2×(S+1) bits] by combining sequential two working strings in the working data stream.

At first, the combined string having occurrence frequency higher than 3 is detected in the third process step. Then, in the fourth process step, corresponding to the detected combined string, the compression dictionary data is registered in the second storage means. Here, the compression dictionary data is consisted of the dictionary number and the compression identifier bit to have bit length of (S+1) same as the bit length of the working string.

In the fifth process step, data compression utilizing the dictionary is performed. Namely, the combined strings matching with combined strings registered in the dictionary are replaced with respectively corresponding compression dictionary data.

As a results, with respect to the combined string in the working data stream as objective for replacement, 2×(S+1) is replaced with (S+1). Since the combined strings registered in the dictionary has at least 3 of the occurrence frequency, 3×(S+1) or more data can be deleted with respect to one register in the dictionary.

On the other hand, with respect to the data compression at the working data stream, data amount is increased for 3×(S+1) bits or more per one register.

Accordingly, cancelling increased data and decreased data, when the occurrence frequency of the combined string is 3, the data amount is held unchanged. The data compression becomes effective when the occurrence of frequency is greater than or equal to 4.

The third to fifth process steps are repeated until the designated R timers designated in the first process step. At every cycle, the data stream replaced in the fifth step is handled as working data stream in the third process step in the next data compression cycle.

Accordingly, in the second and subsequent dictionary generation and data compression process steps the noncompressed working strings and the compression dictionary data are mixedly presented. In the third to fourth process steps, with respect to the working strings as objective, the combined string having the occurrence frequency greater than 3 can be newly registered in the compression dictionary. Then, in the fifth process step, among combined strings in the working data stream, the combined strings corresponding newly registered combined register are replaced with the newly generated compression dictionary data.

As a result, by repeating the third to fifth process, higher compression ratio can be obtained.

It should be noted that with respect to the combined strings having the occurrence frequency higher than or equal to 3, the compression process will not have effect at that time. However, it will contribute in the subsequent dictionary generation and compression procedure in the repeated cycle.

On the other hand, in the decompression process of the compressed data, with the data stream and the data registered in the dictionary, the original data stream can be reproduced by reversed algorithm with utilizing the dictionary.

Namely, with detecting the compression/non-compression identifier, the compressed bits are present, the working string is replaced with the combined string in the dictionary corresponding to the identifier. On the other hand, when the combined string holds non-compression signal, combined string is maintained as is and next working string is detected and processed. Finally, by removing the noncompression identifier from the working stream, the original data stream can be obtained.

Besides, in the third process step, the constraint is applied has "occurrence frequency is up to a given value (D/R)th" to provide upper limit for the number of the combined strings to be detected.

This is because that in the third to fifth process steps in the repeating cycles, it is possible that the number of combined strings may exceed the maximum register number. By restriction set forth above, the designated repetition cycles for designated number of cycles R.

Alternately, it is possible to set R=1 which is the special setting not to repeat the third to fifth steps.

In this case, by providing correspondence between the two original string as the objective for compression and the dictionary number, decompression can be enabled.

Therefore, in the dictionary generation and compression process steps, the non-compression identifier bit is not added to the original string in the second process step to form the working data stream with taking the original string as S bits working string as is. Also, in the fourth process step, the compression dictionary data is solely consisted of the S bit length of dictionary number.

In certain original data stream, higher speed in compression and decompression is required rather than the compression ratio. The foregoing alternative is suitable in such case.

According to the second aspect of the invention, a data compression system comprises:

first storage means for storing data;

second storage means for storing data;

first means for receiving an original data stream and a repetition command indicative of a desired repetition number of data compression process cycles and separating the original data stream into a plurality of sequential data strings having a fixed unit data length;

second means for comparing combined data strings established by given number of sequential data strings with a content of the first storage means, for registering occurrence data and the combined data string at the first occurrence of a coincidence between the combined data and the content in said second storage means, and for incrementing the occurrence data at second and subsequent occurrences;

third means for generating a dictionary by registering the combined data strings which has occurrence data satisfying a predetermined register condition, together with dictionary identifiers thereof, in the second storage means;

fourth means for replacing combined data strings in the data stream with the corresponding dictionary identifiers; and fifth means for controlling operations of the first to fourth means for repeating data compression cycles for the desired repetition number indicated in the repetition command.

The first means may add a compression state identifier bit for each fixed length of data fraction in the data stream to formulate the data string.

The third means may register the dictionary identifier incorporating the compression status identifier indicative of compressed state.

The second means may form the combined data string with two sequential data strings of fixed unit data length, and the third means generates the dictionary identifier having data length corresponding to the fixed unit data length.

According to the third aspect of the invention, a data compression system comprises:

first storage means for storing data;

second storage means for storing data;

first means for receiving an input sequential data signal and a repetition command signal indicative of a desired repetition number of data compression process cycles and sequentially extracting fraction signals of a given fixed bit length from the input sequential data signal;

second means for sequentially extracting segment signals having a bit length plurality times of the given fixed bit length of the fraction signals from input sequential data signal, comparing the content of each of the segment signal with a content of the first storage means, for registering an occurrence counter signal value and the segment signal in said second storage means at the first occurrence of a coincidence between the contents of each of said segment signal and the contents of said first storage means, and for incrementing the occurrence counter signal value at second and subsequent occurrences;

third means for generating a dictionary by registering, in said second storage means, the segment signals corresponding to the occurrence counter signal satisfying a predetermined register condition, together with dictionary identifier signals thereof;

fourth means for replacing data segment in the input sequential data signal corresponding to the segment signals registered in the second storage means with the corresponding respectively corresponding dictionary identifier signals; and fifth means for generating control signals for controlling operations of the first to fourth means for repeating data compression cycles for the desired repetition number indicated in the repetition command.

According to the fourth aspect of the invention, an operation method of compression system including first and second storage, comprising the steps of:

receiving an ordinal data stream and a repetition command indicative of desired repetition number of data compression process cycles and separating the original data stream into a plurality of sequential data strings having fixed unit data length;

comparing combined data strings established by a given number of sequential data strings with a content of the first storage for registering occurrence data and the combined data string at the first occurrence of a coincidence between the combined data strings and the content and for incrementing the occurrence data at second and subsequent occurrences;

generating a dictionary by registering the combined data strings which has occurrence data satisfying a predetermined register condition, together with dictionary identifiers thereof, in the second storage;

replacing combined data strings in the data stream with the corresponding dictionary identifiers; and controlling operations of the first to fourth means for repeating data compression cycles for the desired repetition number indicated in the repetition command.

BRIEF DESCRIPTION OF THE DRAWINGS

The present invention will be understood more fully from the detailed description given herebelow and from the accompanying drawings of the preferred embodiment of the invention, which, however, should not be taken to be limitative to the present invention, but are for explanation and understanding only.

In the drawings:

FIG. 5 is an illustration showing an example of working data stream to be generated from an original data stream;

FIG. 6 is an illustration showing a register data of a dictionary generated in the first cycle of dictionary generation procedure;

FIG. 7 is an illustration showing a working data stream generated in the first cycle of compression procedure;

FIG. 8 is an illustration showing a register data of a dictionary generated in the second cycle of dictionary generation procedure;

FIG. 9 is an illustration showing a working data stream generated in the second cycle of compression procedure;

FIG. 10 is an illustration showing a register data of a dictionary generated in the third cycle of dictionary generation procedure;

FIG. 11 is an illustration showing a working data stream generated in the third cycle of compression procedure;

FIG. 12 is an illustration showing a register data of a dictionary generated in the fourth cycle of dictionary generation procedure; and FIG. 13 is an illustration showing a working data stream generated in the fourth cycle of compression procedure.

DESCRIPTION OF THE PREFERRED EMBODIMENT

The data compression method according to the preferred embodiment of the present invention will be discussed hereinafter in detail with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to unnecessary obscure the present invention.

Figure 1:
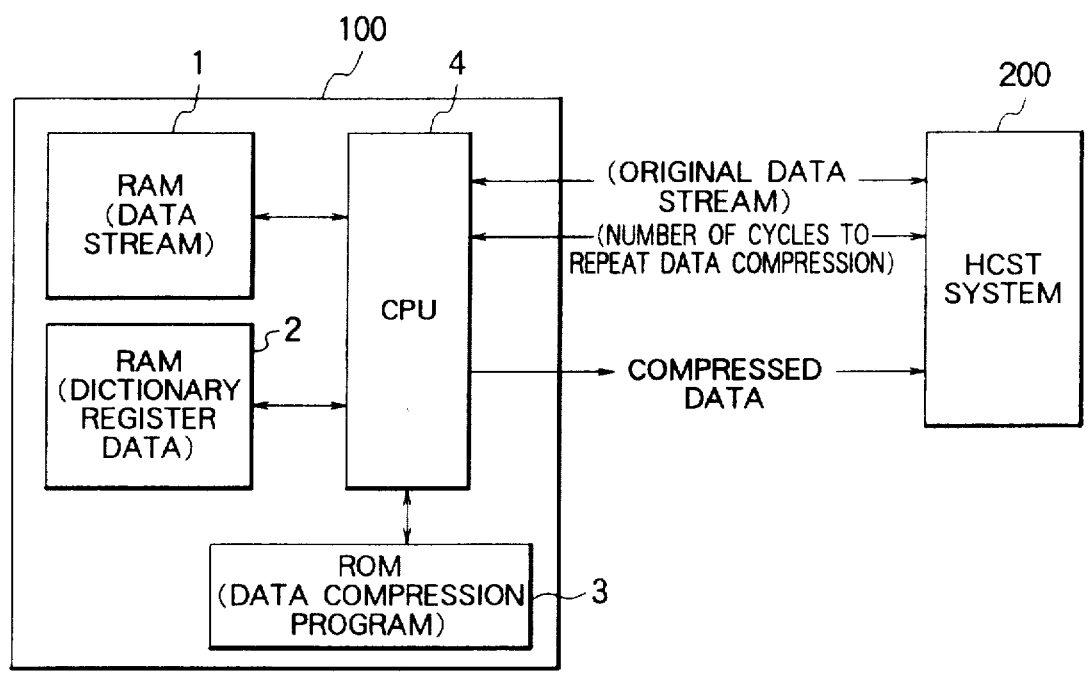
FIG. 1 is a block diagram showing a data compression system according to the preferred embodiment of the present invention.

FIG. 1 is a block diagram showing system construction of a data compression system 100 for implementing data compression. In FIG. 1, the reference numeral 1 denotes RAM for storing data stream, 2 denotes RAM for storing dictionary register data, 3 denotes ROM storing a data compression program, 4 denotes CPU. As can be seen, the data compression system is connected to a host system 200. The host system 200 is designed to supply an original data stream and a designation for number of cycles to repeat data compression to the data compression system, which designation will be hereinafter referred to as "repetition number command", and to receive compressed data from the data compression system. The original data stream transmitted to the data compression system 100 from the host system 200 is received by CPU 4. Then, CPU 4 performs data compression by software according to a data compression program stored in ROM 3 with utilizing RAMs 1 and 2. It should be noted that while RAMs 1 and 2 are illustrated in FIG. 1, it is, of course, possible to define a data stream storage region and a dictionary register data storage region in a single RAM.

Figure 2:
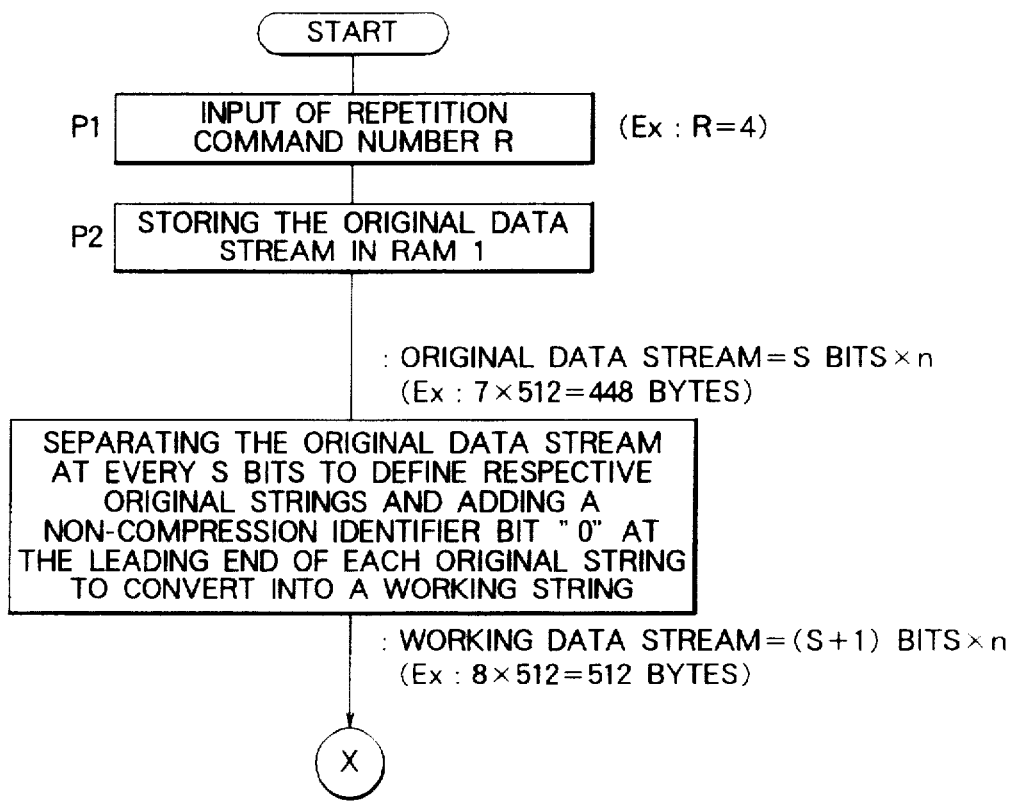
FIG. 2 is a flowchart showing a procedure of generation of a working data stream.

Next, the data compression process of the preferred embodiment of the invention will be discussed with reference to the flowcharts of FIGS. 2 to 4 and data tables illustrated in FIGS. 5 to 12 showing the contents of actual data stream and dictionary register data.

At first, when the repetition number command R is input from the host system 200, CPU 4 stores the value thereof in an internal buffer. Thereafter, when the original data stream is received, CPU 4 stores the received original data stream in RAM 1 (steps P1 and P2 in FIG. 2).

Assuming that the original data stream is consisted of N in number of original strings respectively having data length of S bits, CPU 4 separates the original data stream stored in RAM1 at every S bits to define respective original strings. Then, a non-compression identifier bit "0" is added at the leading end of each original string to convert into a working string. Thus, a working data stream consisted of N in number of working strings having the data length of (S+1) bits, is formed (step P3 in FIG. 2).

The shown embodiment of working data stream will be discussed with reference to FIG. 5.

The working data stream of FIG. 5 is formed from the original data stream consisted of 512 in number of the original string having the data length of 7 bits. Therefore, in FIG. 5, there is illustrated 512 in number of 8 bit working string in a form of hexadecimal number.

Each working string is expressed in a range of values 00 to 3d in hexadecimal number and has the most significant bit (MSB) set at "0" as non-compression identifier bit. It should be noted that, in the shown embodiment, all of the original string of the original data stream have data contents which can be expressed by 6 bits in binary number "000000" to "111101". Therefore, each working string of the working data stream can be expressed in a range of 00 to 3 d. However, even when the original string contains data to be expressed by 7 bits, no problem will be arisen.

Next, CPU 1 reads out two sequent working strings (combined string) from the working data stream stored in RAM 1 in order from the leading address. At every occurrence of reading out of the combined string, CPU 1 checks if the read out combined string is the strings read out in the past, on the basis of register content of RAM 2. If the read out current combined string is new, an occurrence frequency data "1" and the current combined string in RAM 2. On the other hand, when the current combined string is the string which is already registered in RAM 2, the occurrence frequency data corresponding thereto is incremented by 1 (steps P4 to P10 in FIG. 3).

Accordingly, when the foregoing procedure is taken place for overall working data stream stored in RAM 1, data content and occurrence frequency data of all of the combined strings in the working data stream are registered with establishing correspondence.

Then, CPU 4 checks respective of the registered combined strings in terms of the following two conditions:

(1) if the order of the combined string in question has the occurrence frequency data ordered at an order higher than D/Rth (wherein D is $2^s$) as ordered in descending order from one having the largest occurrence frequency data; and (2) if the occurrence frequency data is greater than or equal to 3. When the combined string in question satisfies both terms, such combined string is determined to be maintained, and otherwise the combined string is removed. Then, for each of the remained combined data, compression dictionary data consisted of compression identifier bit "1" and a dictionary number, is assigned and fixedly registered.

It should be noted that the foregoing term (1) is set at D/R as an average value of an upper limit of registering number in respective cycles of compression procedure under the condition where the maximum registering number of the dictionary is D and designated number of repetition cycles as discussed later is R. This is because that while it depends on the content of the working data stream but in most case, number of combined strings satisfying the term (2) becomes quite large in the initial repetition cycles of the compression procedure to cause overflow of the predetermined registering capacity of the dictionary to make it impossible to perform compression procedure for the demanded number of cycles. Therefore, by thinning combined strings having lesser occurrence frequency, capability of repetition of the compression procedure for the demanded number of cycles is assured.

The necessity of the second term (2) will be discussed later in the discussion for the data compression procedure.

Figures 6, 7:
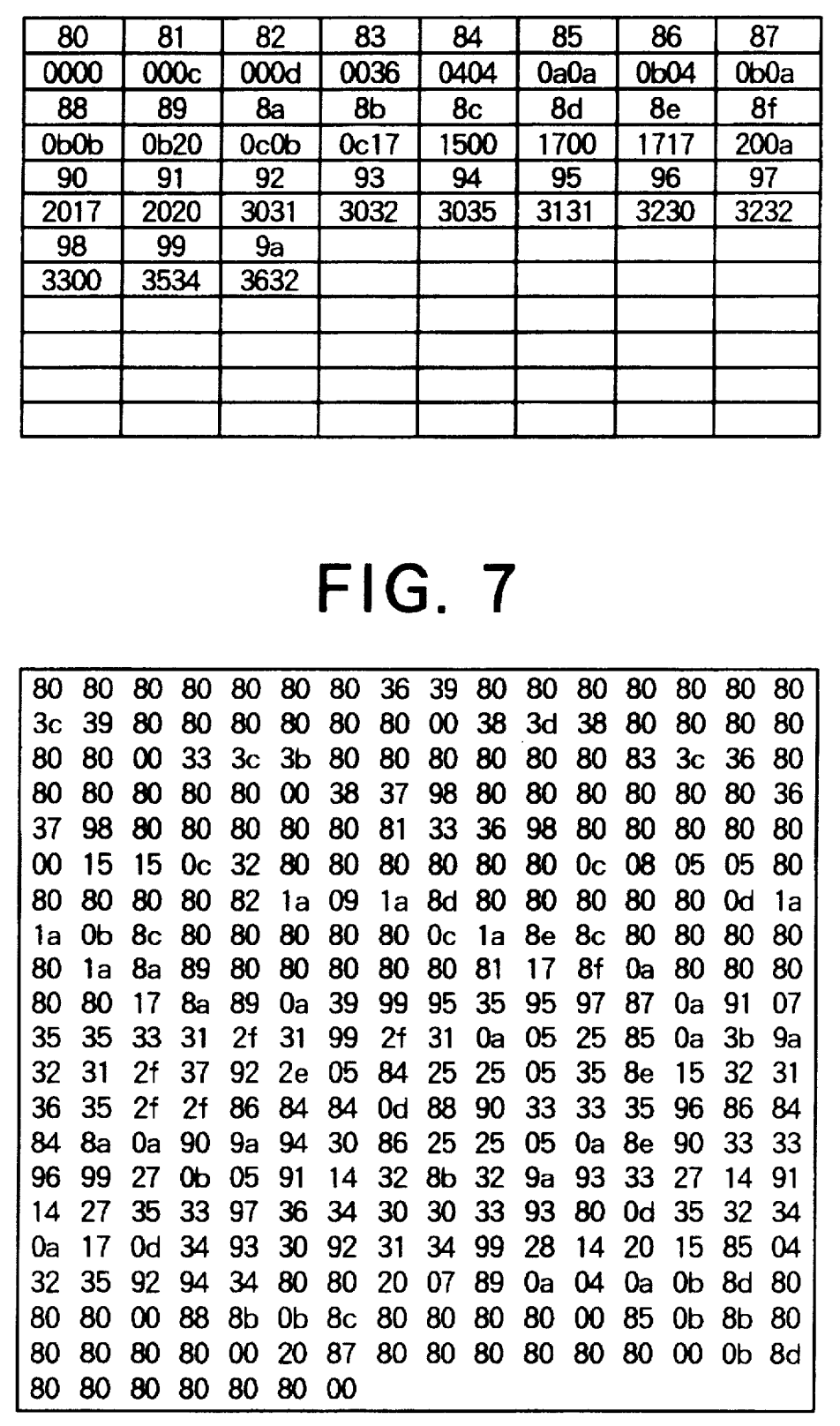

Here, the dictionary register data obtained through the foregoing dictionary generating procedure with respect to the working data stream of FIG. 5, is shown in FIG. 6.

In FIG. 6, the data described by hexadecimal number of 80 to 9a are the compression dictionary data. Data associated with respective compression dictionary data correspond to data satisfying the foregoing terms (1) and (2). In the shown example, 27 combined strings are registered.

Since the compression dictionary data is started from hexadecimal number 80, MSB of all data become "1". This bit (MSB) serves as the compression identifier bit. With subsequent 7 bits, 128 (=D: maximum registering number of the dictionary) of dictionary numbers are expressed.

In the shown example, designated repetition number is set at "4"(R=4), and thus D/R=32. Therefore, all combined string satisfies the foregoing term (1).

Next, CPU 14 moves to the compression process for the working data stream utilizing the dictionary register data.

In the compression process, at first, the combined strings of the working data stream stored in RAM 1 are sequentially read out from the leading address. Then, the read out combined strings are compared with respective combined strings registered in RAM 2 (steps P12 and P13 in FIG. 4).

When the matching combined string is present in RAM 2, the corresponding combined string in RAM 1 is replaced with the compression dictionary data stored in RAM 2 and corresponding to the registered combined string matching with the read out combined string (steps P14 and P15). Namely, at this stage, 2×(S+1) bits of combined string is replaced with (S+1) bits of compression dictionary data.

Figure 4:
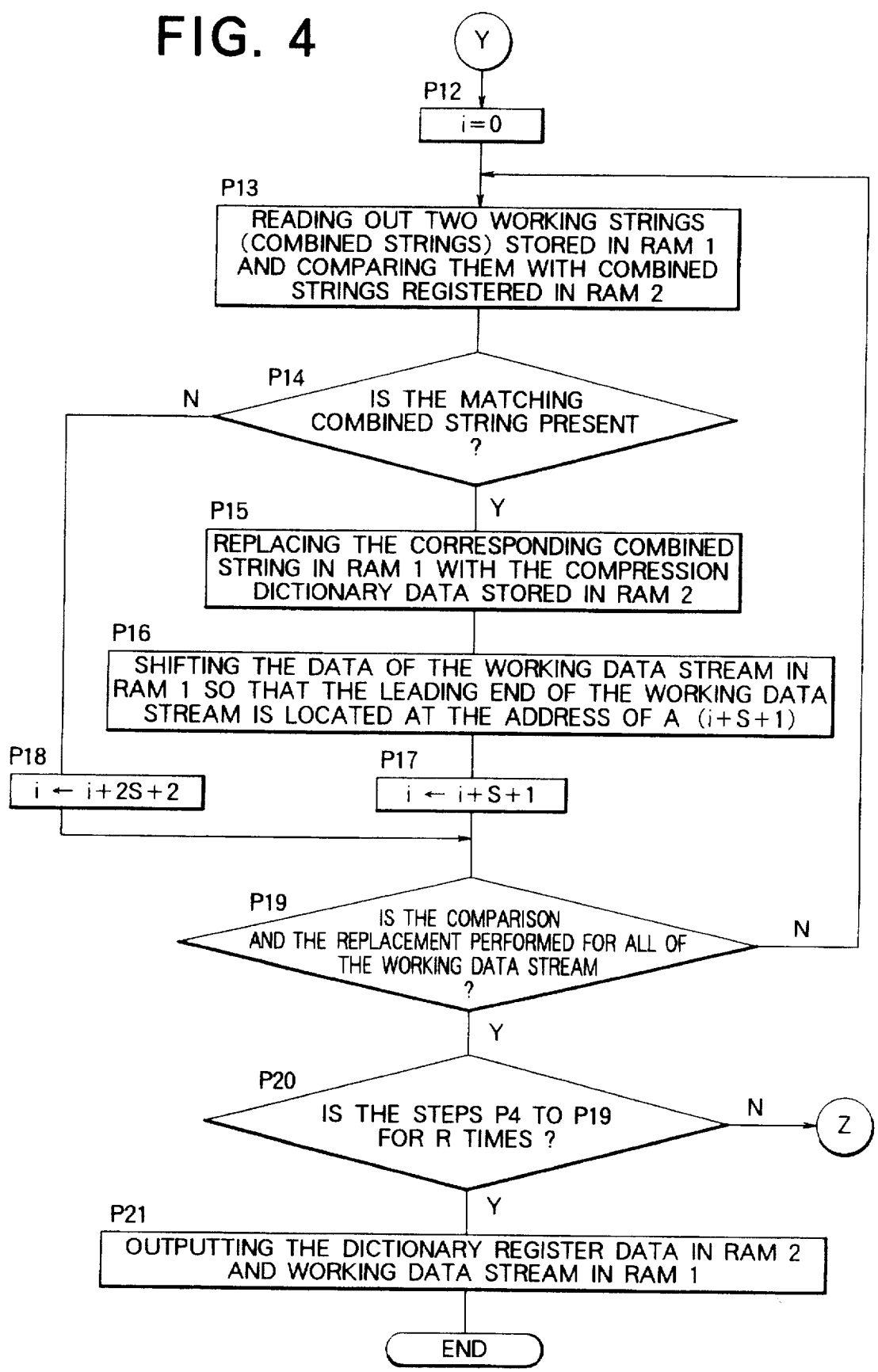
FIG. 4 is a flowchart showing a procedure of compression.

Also, when the foregoing replacement is performed, CPU 4 shifts the data of the working data stream following the combined string which is the objective for replacement in order so that the leading end of the shifted part of the working data stream is located at the address immediately following the trailing end of the replaced data (step P16 in FIG. 4). Namely, since data length is reduced by compression for (S+1) bits, the subsequent part of data is shifted for the correspondingly to maintain continuity of the working data stream.

On the other hand, when the matching combined string is not present in RAM 2 (steps P13, P14 in FIG. 4), the read out RAM 1 is maintained as is, and process moved to comparison for next combined string.

Accordingly, when the combined string of RAM 1 is replaced with the compression dictionary data, the next combined string is read out by advancing the read out address for (S+1), and when the combined string of RAM 1 is not replaced, the next combined string is read out by advancing the read out address for 2×(S+1) (step P18 in FIG. 4).

The foregoing compression process for each individual combined string (steps P13 to P18 in FIG. 4) is performed for all of the combined strings in the working data stream in RAM 1 (step P19 in FIG. 4). Then, the first cycle of dictionary generation and compression procedure is completed.

Here, in the foregoing compression procedure, since the combined string in RAM 1 as objective for replacement should satisfy the foregoing term (2). Therefore, at least three same combined strings are present in the working data stream. Therefore, observing the working data stream, with one dictionary register data, at least 3×(S+1) bits data compression can be achieved.

On the other hand, one dictionary register data is consisted of (S+1) bits of compression dictionary data and 2×(S+1) of combined string. Therefore, one dictionary register data occupies 3×(S+1) bits.

Therefore, in view of total data capacity of the dictionary register data and the working data stream, the combined string having occurrence frequency F=3 does not contribute for data compression in the first cycle of dictionary generation and compression procedure. However, the combined strings having occurrence frequency F greater than or equal to 4, data compression for (F−3)×(S+1) bits can be realized.

It should be appreciated that even the combined string having the occurrence frequency F=3, it serves for replacing the 2×(S+1) of combined string with (S+1) bits of compression dictionary data. Therefore, such combined string contributes for improvising data compression efficiency in the second and subsequent cycles of dictionary generation and compression procedures.

When the first cycle of dictionary generation and compression procedure (steps P12 to P19 in FIGS. 3 and 4) is performed for the working data stream of FIG. 5 with respective dictionary register data of FIG. 6, a working data stream (hereinafter referred to as once compressed data stream) as illustrated in FIG. 7 can be obtained.

In the first cycle of dictionary generation and compression procedure, the total capacity of the original data stream is 448 bites. On the other hand, the total capacity of the dictionary register data of FIG. 6 and the once compressed working data stream of FIG. 7 is 408 bites (=81bites+327 bites). Therefore, approximately 91.1% of data compression can be obtained.

Figure 3:
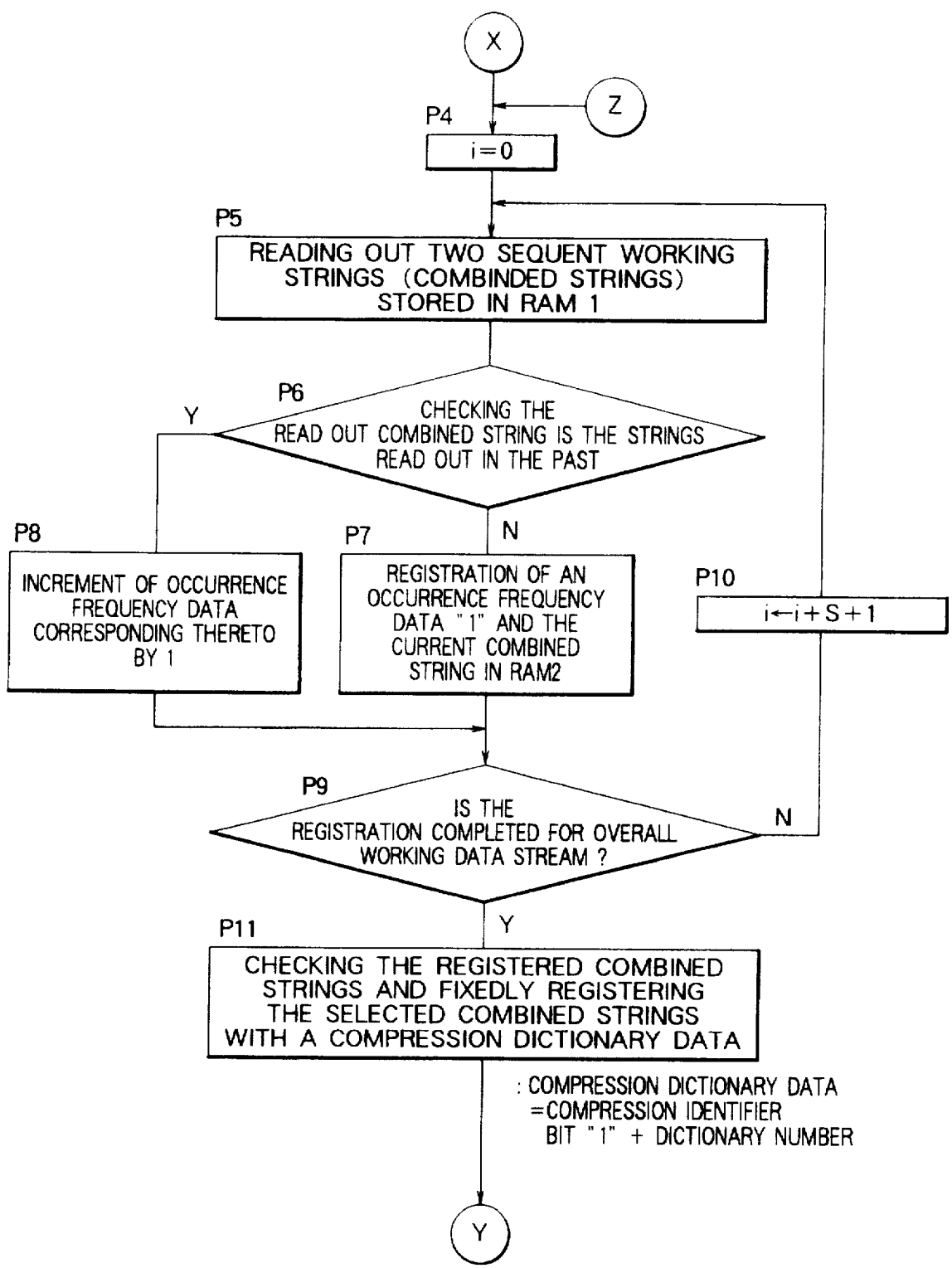
FIG. 3 is a flowchart showing a procedure of generation of a dictionary.

Subsequently, with taking the working data stream obtained through the first cycle of data compression procedure as new objective for compression, the dictionary generation and compression procedure (steps P4 to P19) illustrated in FIGS. 3 and 4 is repeated for the demanded repetition number R (step P20 in FIG. 4 - step P4 in FIG. 3).

It should be noted that, in the repeatedly performed dictionary generation and compression procedure, the working data stream to be taken as the objective for compression is the result of the immediately preceding data compression procedure. Naturally, in the working data stream, there are mixedly present the non-compressed working string and compression register data, as shown in FIG. 8.

Figures 8, 9:
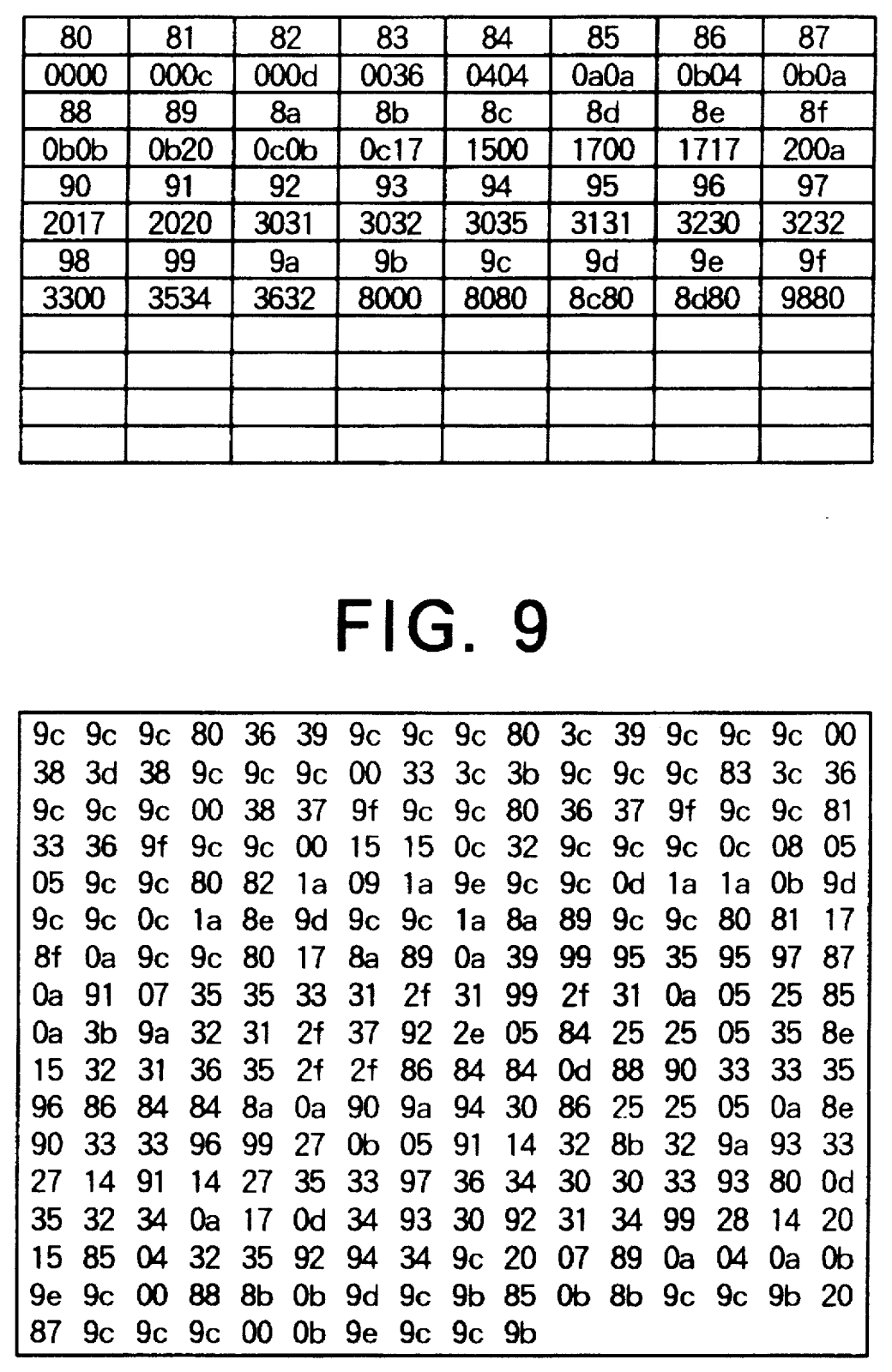

As can be clear from FIG. 8, as the compression dictionary data 9b to 9f are additionally registered corresponding to each of the working strings. The working data stream obtained through data compression utilizing the additionally registered dictionary register data is illustrated in FIG. 9.

In the second cycle of dictionary generation and compression procedure, since the total capacity of the dictionary register data of FIG. 8 and the working data stream of FIG. 9 is 362 bites (=96 bites+266 bites), the data compression ratio of about 80.8% can be achieved.

Figures 10, 11:
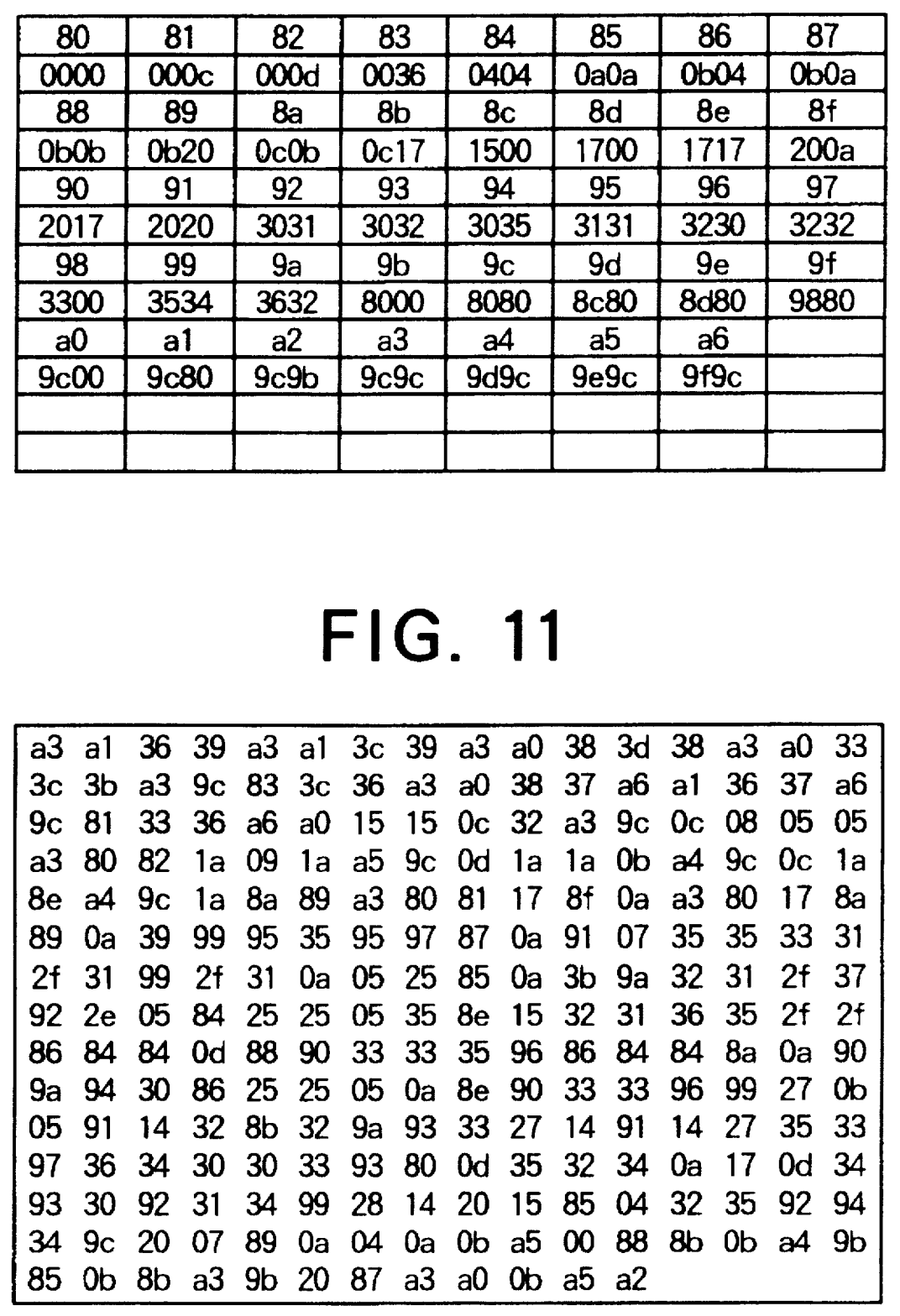
Figures 12, 13:
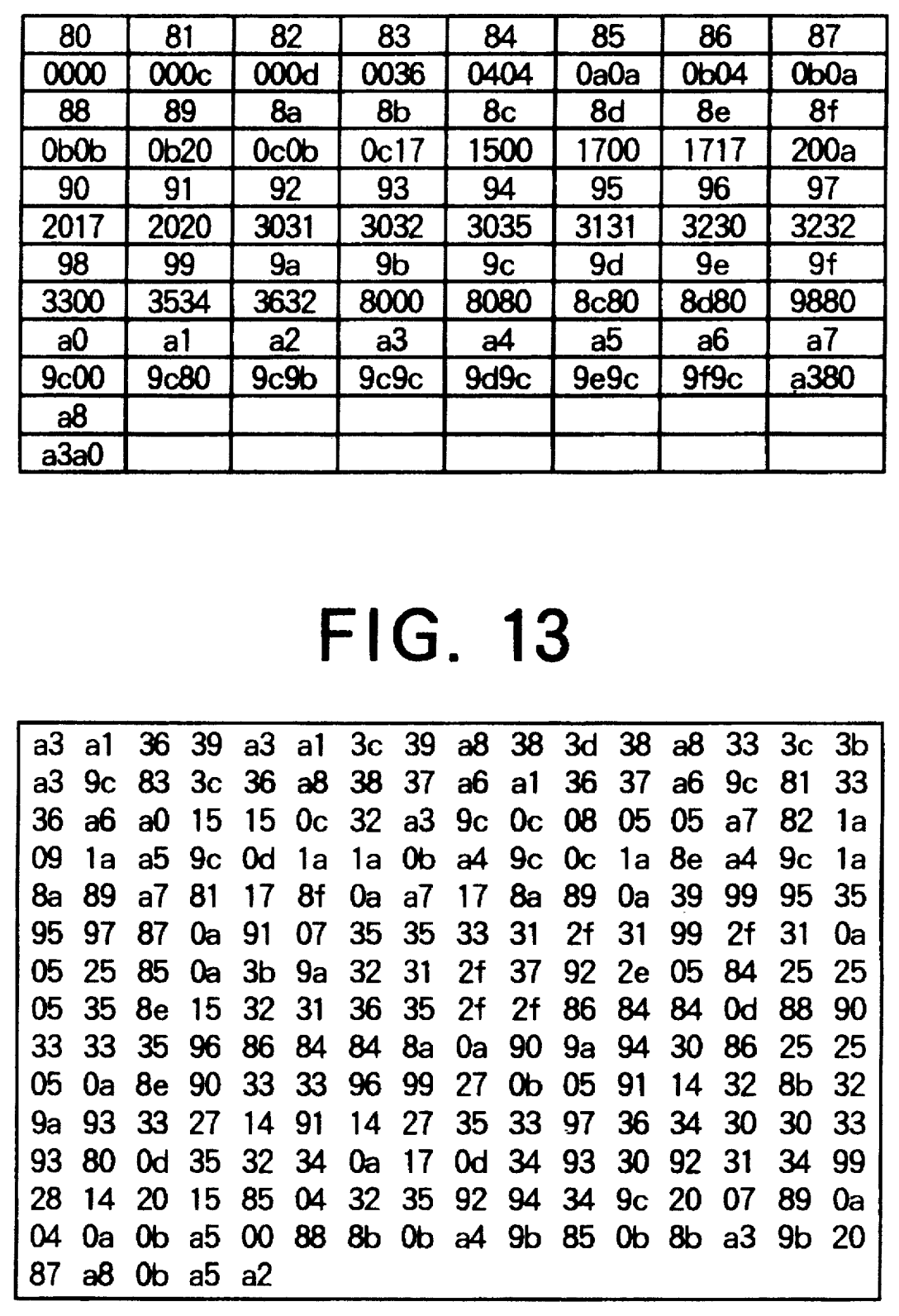

Similarly, in the third cycle of dictionary generation and compression procedure, the dictionary register data of FIG. 10 and the working data stream of FIG. 11 are obtained. The total capacity of the dictionary register data and the working data stream of FIGS. 10 and 11 becomes 353 bites. Therefore, the compression ratio becomes about 78.8%. Also, in the fourth cycle of dictionary generation and compression procedure, the dictionary register data of FIG. 12 and the working data stream of FIG. 13 are obtained. The total capacity of the dictionary register data and the working data stream of FIGS. 12 and 13 becomes 352 bites. Therefore, the compression ratio becomes about 78.6%.

When designated number of cycles of dictionary generation and compression procedure is completed, CPU 4 reads out all dictionary register data in RAM 2 and the compressed working data stream in RAM 1 and transmits to the host system 200 (step P21 in FIG. 4).

On the other hand, the transferred compressed data is decompressed and reproduced in the following manner.

At first, the working string is detected per (S+1) from the leading end of the compressed working data stream. When the MSB of the read out (S+1) bits is "1", judgement can be made that the objective working string has been replaced with the compression dictionary data. Therefore, utilizing the dictionary register data, the combined string corresponding to the relevant compression dictionary data is replaced. On the other hand, when the MSB of the read out (S+1) bits is "0", the combined string has been maintained without being replaced. Therefore, process is moved to the next combined string. Then, by executing the foregoing procedure for entire working data stream, first cycle decompressed working data stream is obtained. The same procedure is repeated for R times to finally reproduce the working data stream before compression.

It should be noted that since the non-compression identifier bit of "0" is added at MSB of each working string of the finally obtained working data stream, the original data stream is obtained by removing MSB of respective working string.

It should be noted that the shown embodiment registers the compression dictionary data consisted of the compression identifier bit "1" and the dictionary number, it is possible to store a stream of the compression/non-compression identifier bit in separate memory area as required for hardware or software construction.

It should be further noted that while the shown embodiment relates the dictionary generation and compression procedure for a plurality of times depending upon the designated repetition number R, performing dictionary generation and compression for only once (R=1) can be more convenient in certain case.

For instance, in certain type of data stream content, one time of compression procedure may achieve relatively high compression ratio, and may be required high speed data decompression and reproduction.

Therefore, when CPU 4 detects that designated repetition number R is "1", the non-compression identifier bit of "0" is not added to the original string in the working data stream generating procedure. In such case, only S bits dictionary number is stored as the compression dictionary data in the dictionary generation procedure of FIG. 3. Then, in the compression procedure of FIG. 4, the working string is handled as S bits data.

In this case, the total capacity of the finally obtained dictionary register data and the compressed data stream can be reduced. Also, since the compression procedure is performed only once, compression and noncompression can be discriminated from the combined string per se registered in RAM 2 upon decompression and reproduction.

Accordingly, data transmission period and decompression and reproduction period can be significantly shortened so as to permit high speed image display in the case of image data or so forth.

It should be noted that since compression procedure is performed only once, high compression ratio cannot be expected. However, by combining the foregoing method with known algorithm, such as run length method and so forth, this drawback may be solved.

The data compression method according to the present invention constructed as set forth above may achieve the following advantages.

The present invention employs a method for performing data compression by replacing fixed length of sequentially or discretely presenting combined string into a fixed length of string with half length with adding the compression/noncompression identifier bit. Therefore, by simplicity of algorithm of compression and decompression, high speed compression and decompression process is permitted.

Also, since the present invention can be realized solely by the software process, it can be realized by simple system constituted of RAM, CPU and so forth.

In particularly, assuming that the working string is 1 bite and the combined string as a unit for process in the working data stream and dictionary register data is 2 bites, it becomes possible to effectively compress even small data block, such as 64 bite which cannot be compressed in the conventional method.

Also, while high compression ratio cannot be expected, data transmission period and period required for compression or decompression can be shortened. Therefore, it becomes possible to provide data compression method which can be adaptively employed in the case where high speed image display is required, such as for game machine and so forth.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodies within a scope encompassed and equivalents thereof with respect to the feature set out in the appended claims.

What is claimed is:

1. A data compression method, in which a data stream of a digital input signal is stored in first storage means and data compression of the data stream is performed with registering strings appearing in said data stream in a dictionary of second storage means, comprising:

performing first process step for designating R representing a repetition number of the following third to fifth process steps wherein R is an integer smaller than or equal to D, with taking a total data capacity of the original data stream being S×N bits, wherein S is an integer greater than or equal to 2 and N is an integer greater than or equal to 3, and a maximum dictionary register number D where D is $2^s$;

performing second process step for separating the original data stream of S bit length stored in said storage means and generating a working data stream by adding a non-conducting identifier bit for conversion into a working data stream having (S+1) bit working strings;

performing third process step for detecting combined string consisted of two sequential working strings in said working data stream up to D/Rth order in descending order from working string having largest occurrence frequency, and having occurrence frequency greater than or equal to 3;

performing fourth process step for registering compression dictionary data of (S+1) bits consisted of dictionary number and compression identifier bit, in said second storage means, corresponding to each of combined strings detected by said third process step; and fifth process step for replacing combined string among combined strings in said working data stream matching with one of combined strings registered in said second storage means, with the compression dictionary data corresponding to the matching combined string, repeating said third to fifth process steps for R times with taking data stream replaced through said fifth process step as working data stream for outputting data stream stored in said first storage means and all combined string and compression dictionary data stored in said second storage means, after R times repletion, as compressed data.

2. A data compression method as set forth in claim 1, wherein when R=1, said second process step is performed without adding said non-compression identifier bit to establish said working data stream take the original strings as said working strings, and said fourth process step is performed with formulating said compression dictionary data solely with said S bit dictionary number.

3. A data compression system comprising:

first storage means for storing data;

second storage means for storing data;

first means for receiving an ordinal data stream and a repetition command indicative of desired repetition number of data compression process cycles and separating said original data stream into a plurality of sequential data strings having a fixed unit data length;

second means for comparing combined data strings established by given number of sequential data strings with a content of said first storage means, for registering occurrence data and the combined data string at the first occurrence of a coincidence between the combined data and the content in said second storage means, and for incrementing said occurrence data at second and subsequent occurrences;

third means for generating a dictionary by registering said combined data strings which has occurrence data satisfying a predetermined register condition, together with dictionary identifiers thereof, in said second storage means;

fourth means for replacing combined data strings in said data stream with the corresponding dictionary identifiers; and fifth means for controlling operations of said first to fourth means for repeating data compression cycles for the desired repetition number indicated in said repetition command.

4. A data compression system as set forth in claim 3, wherein said first means adds a compression state identifier bit for each fixed length of data fraction in said data stream to formulate said data string.

5. A data compression system as set forth in claim 4, wherein said third means registers said dictionary identifier incorporating said compression status identifier indicative of compressed state.

6. A data compression system as set forth in claim 3, wherein said second means forms said combined data string with two sequential data strings of a fixed unit data length, and said third means generates said dictionary identifier having a data length corresponding to said fixed unit data length.

7. A data compression system comprising:

first storage means for storing data;

second storage means for storing data;

first means for receiving an input sequential data signal and a repetition command signal indicative of a desired repetition number of data compression process cycles and sequentially extracting fraction signals of a given fixed bit length from said input sequential data signal;

second means for sequentially extracting segment signals having a bit length plurality times of said given fixed bit length of said fraction signals from input sequential data signal, comparing the content of each of said segment signal with a content of said first storage means, for registering an occurrence counter signal value and said segment signal in said second storage means at the first occurrence of a coincidence between the contents of each of said segment signal and the contents of said first storage means, and for incrementing said occurrence counter signal value at second and subsequent occurrences;

third means for generating a dictionary by registering, in said second storage means, said segment signals corresponding to said occurrence counter signal satisfying a predetermined register condition, together with dictionary identifier signals thereof;

fourth means for replacing data segment in said input sequential data signal corresponding to said segment signals registered in said second storage means with the corresponding respectively corresponding dictionary identifier signals; and fifth means for generating control signals for controlling operations of said first to fourth means for repeating data compression cycles for the desired repetition number indicated in said repetition command.

8. A data compression system as set forth in claim 7, wherein said first means adds a compression state identifier bit for each fixed length of data fraction in said input sequential data signal to formulate said fraction signal.

9. A data compression system as set forth in claim 8, wherein said third means registers said dictionary identifier signal incorporating said compression status identifier bit indicative of compressed state.

10. A data compression system as set forth in claim 7, wherein said second means forms said segment signal with two sequential fraction signals, and said third means generates said dictionary identifier signal having a bit length corresponding to said given fixed bit length.

11. An operation method of compression system including first and second storage, comprising the steps of:

receiving an ordinal data stream and a repetition command indicative of desired repetition number of data compression process cycles and separating said original data stream into a plurality of sequential data strings having fixed unit data length;

comparing combined data strings established by a given number of sequential data strings with a content of said first storage for registering occurrence data and the combined data string at the first occurrence of a coincidence between the combined data strings and the content and for incrementing said occurrence data at second and subsequent occurrences;

generating a dictionary by registering said combined data strings which has occurrence data satisfying a predetermined register condition, together with dictionary identifiers thereof, in said second storage;

replacing combined data strings in said data stream with the corresponding dictionary identifiers; and controlling operations of said first to fourth means for repeating data compression cycles for the desired repetition number indicated in said repetition command.

* * * * *